(12) United States Patent
Zupac et al.

(10) Patent No.: US 8,546,908 B2
(45) Date of Patent: Oct. 1, 2013

(54) HIGH EFFICIENCY AMPLIFIER WITH REDUCED PARASITIC CAPACITANCE

(75) Inventors: Dragan Zupac, Chandler, AZ (US); Brian D. Griesbach, Austin, TX (US); Theresa M. Keller, Chandler, AZ (US); Joel M. Keys, Austin, TX (US); Sandra J. Wipf, Austin, TX (US); Evan F. Yu, Rancho Palos Verdes, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 315 days.

(21) Appl. No.: 13/159,635

(22) Filed: Jun. 14, 2011

(65) Prior Publication Data

US 2011/0241159 A1    Oct. 6, 2011

Related U.S. Application Data

(62) Division of application No. 12/109,798, filed on Apr. 25, 2008, now Pat. No. 7,982,282.

(51) Int. Cl.
*H01L 29/735* (2006.01)

(52) U.S. Cl.
USPC .................. 257/517; 257/510; 257/E29.187; 257/E29.199; 257/526

(58) Field of Classification Search
None
See application file for complete search history.

(56) References Cited

U.S. PATENT DOCUMENTS

| | | | |
|---|---|---|---|
| 6,051,868 A | 4/2000 | Watanabe et al. | |
| 6,104,054 A | 8/2000 | Corsi et al. | |
| 6,525,392 B1 * | 2/2003 | Leonardi | 257/500 |
| 6,815,780 B1 | 11/2004 | Khemka et al. | |
| 7,253,070 B2 | 8/2007 | Greenberg et al. | |

* cited by examiner

*Primary Examiner* — Matthew W Such
*Assistant Examiner* — Scott Stowe
(74) *Attorney, Agent, or Firm* — Ingrassia Fisher & Lorenz, P.C.

(57) ABSTRACT

A semiconductor amplifier is provided comprising, a substrate and one or more unit amplifying cells (UACs) formed on the substrate, wherein each UAC is laterally surrounded by a first lateral dielectric filled trench (DFT) isolation wall extending at least to the substrate and multiple UACs are surrounded by a second lateral DFT isolation wall of similar depth outside the first isolation walls, and further semiconductor regions lying between the first isolation walls when two or more unit cells are present, and/or lying between the first and second isolation walls, are electrically floating with respect to the substrate. This reduces the parasitic capacitance of the amplifying cells and improves the power added efficiency. Excessive leakage between buried layer contacts when using high resistivity substrates is avoided by providing a further semiconductor layer of intermediate doping between the substrate and the buried layer contacts.

20 Claims, 7 Drawing Sheets

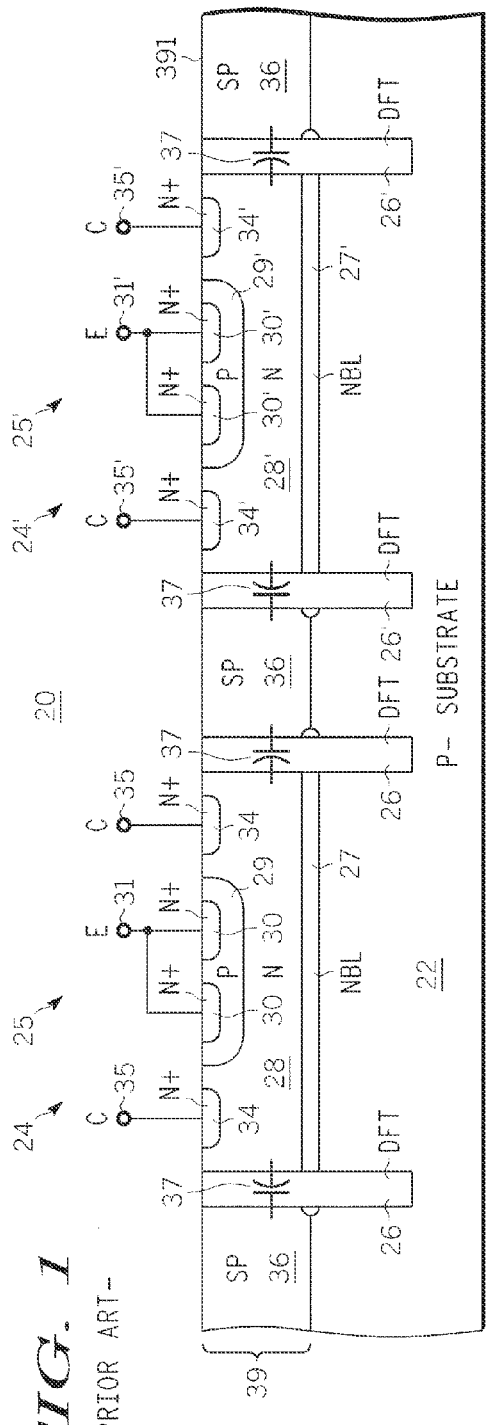
FIG. 1 —PRIOR ART—
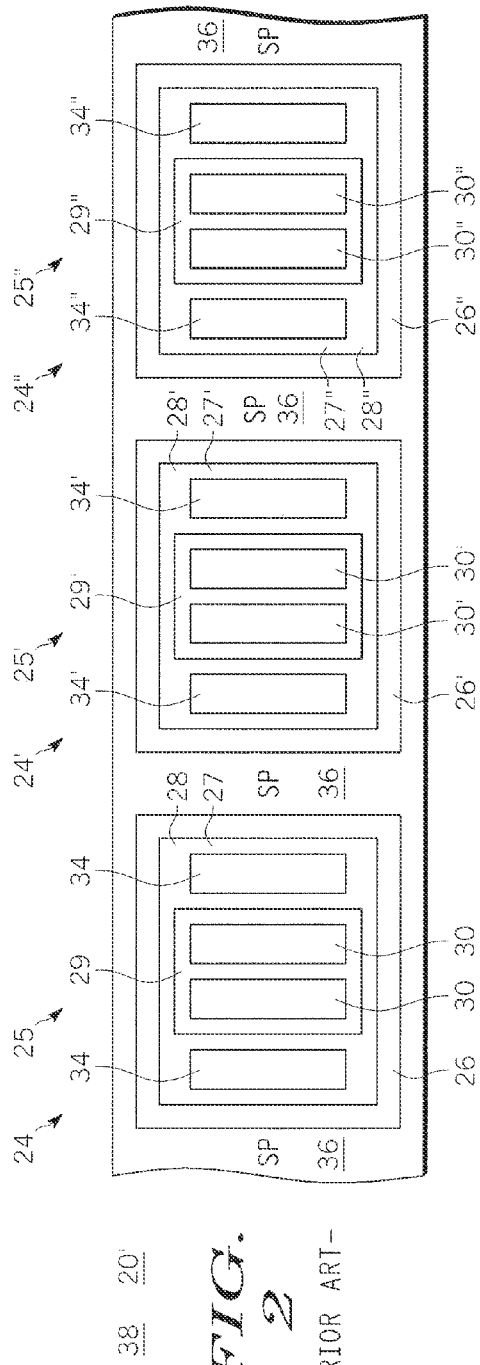
FIG. 2 —PRIOR ART—

HIGH EFFICIENCY AMPLIFIER WITH REDUCED PARASITIC CAPACITANCE

RELATED APPLICATION

This application is a divisional of U.S. patent application Ser. No. 12/109,798, filed on Apr. 25, 2008.

FIELD OF THE INVENTION

The present invention generally relates to semiconductor (SC) devices and integrated circuits (ICs) and, more particularly, to semiconductor amplifiers having reduced parasitic capacitance and higher power conversion efficiency.

BACKGROUND OF THE INVENTION

Modern electronic devices, especially semiconductor (SC) devices and integrated circuits (ICs) often employ amplifiers whose overall performance and efficiency depend critically on the parasitic capacitance and efficiency of the amplifying transistors and on other circuit elements. If the parasitic capacitance is too high, amplifier efficiency and frequency response can suffer. Accordingly, there is an ongoing need to provide semiconductor amplifiers in which such parasitic capacitance is reduced so as to achieve improved power conversion efficiency.

BRIEF DESCRIPTION OF THE DRAWINGS

The present invention will hereinafter be described in conjunction with the following drawing figures, wherein like numerals denote like elements, and wherein:

FIG. 1 is a simplified schematic cross-sectional view of two unit cells of a present day bipolar amplifier according to the prior art, but illustrating how undesirable parasitic collector capacitance can arise;

FIG. 2 is a simplified plan view of three unit cells of a prior art bipolar amplifier analogous to that depicted in cross-section in FIG. 1;

DETAILED DESCRIPTION OF THE INVENTION

Figure 3:
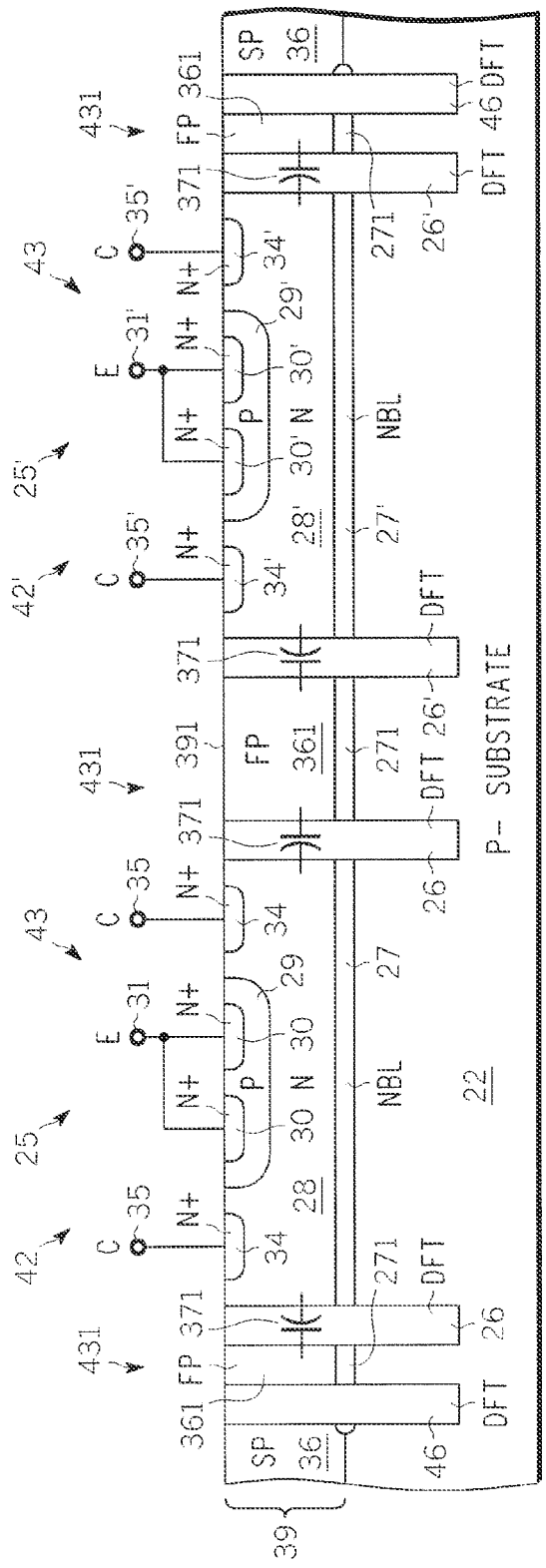
FIG. 3 is a simplified schematic cross-sectional view of two unit cells of a bipolar amplifier having reduced parasitic collector capacitance according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

The various embodiments of the invention described herein are illustrated by semiconductor devices and structures of particular conductivity type, as for example an NPN bipolar transistor having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. For example, reference to an N-type buried layer (NBL) in an NPN transistor is intended to also represent a P-type buried layer of a PNP transistor, etc. Alternatively, the particular regions illustrated in what follows may be more generally referred to as of a "first conductivity type" and a "second opposite conductivity type", where the first conductivity type may be either N or P type and the second opposite conductivity type is then either P or N type, and so forth. Silicon is an example of a suitable semiconductor material for the devices described herein, but persons of skill in the art will understand that the present invention applies to any type of semiconductor employing dielectric trench isolation walls, for example and not intended to be limiting, other type IV materials such as Ge and SiGe combinations, III-V materials, II-VI materials, combinations thereof and so forth. It will also be understood by those of skill in the art, that the present invention is not limited merely to bipolar transistors as shown herein by way of example, but applies to any semiconductor device wherein the principal output region has lateral parasitic capacitance arising from an adjacent isolation wall. While the examples presented herein show two or three unit amplifying cells, those of skill in the art will understand that any number from 1 to N unit amplifying cells may be included depending upon the desired power output. The larger the number of unit cells (or the larger the area of the unit cells) the greater the power output that can be realized.

FIG. 1 is a simplified schematic cross-sectional view of two unit cells 24, 24' of prior art bipolar amplifier 20 formed from two bipolar transistors 25, 25'. FIG. 2 shows simplified plan view 38 of three unit cells 24, 24', 24" of prior art bipolar amplifier 20' analogous to that depicted in cross-section in FIG. 1. FIG. 1 further has capacitor symbols 37 added to indicate how lateral parasitic capacitance can arise in such prior art structures. Referring to FIGS. 1 and 2 together, amplifier 20, 20' comprises substrate 22 (e.g., P-type of resistivity of about 10-20 Ohm-cm), although high resistivity substrates typically of resistivity of about 500 Ohm-cm or greater, may also be used. Amplifier 20, 20' has further semiconductor (SC) layer 39 with upper surface 391 and typically formed by epitaxial growth on substrate 22 in which the various device regions above buried layer (BL) 27, 27', 27" are formed. At the interface between further SC layer 39 and substrate 22 there are provided buried layer regions 27, 27', 27" identified for convenience of description as N-type buried layer regions (abbreviated as "NBL") and having sheet resistance of about 10 Ohms/sq., but higher or lower values may also be used. Above NBL 27, 27', 27" lie N-type collector regions 28, 28', 28" typically of doping density between about 1E16 and 1E18 atoms/cm$^3$ and with N+ collector contact regions 34, 34', 34" and collector terminals 35, 35'. P-type base regions 29, 29', 29" typically of doping density of about 1E18 to 1E19 atoms/cm$^3$ are formed in N-type collector region 28, 28', 28" by any convenient means. In order to avoid unduly cluttering the drawings, base contact regions are not shown in FIGS. 1 and 2, but persons of skill in the art will understand that they are customarily provided. N+ emitter regions 30, 30', 30" with emitter terminals 31, 31' are formed in base regions 29, 29', 29". Dielectric filled trench (abbreviated as "DFT") lateral isolation walls 26, 26', 26" laterally surround each unit cell 24, 24', 24" with transistor 25, 25', 25" and extend from surface 391 at least to substrate 22. Between and laterally outside DFT isolation walls 26, 26', 26" are P-type semiconductor regions 36 in further SC layer 39. These are identified by the abbreviation "SP" to indicate that they are P-type regions ohmically coupled to P-type substrate (S) 22.

Capacitance symbols 37 represent the lateral parasitic capacitance that exists between N type collector regions 28, 28', 28" and SP regions 36 across DFT isolation walls 26, 26', 26". As indicated in FIGS. 1-2, buried layer regions 27, 27', 27" extend between surrounding isolation walls 26, 26', 26" beneath transistors 25, 25', 25", and may, as shown in FIG. 1, protrude slightly beyond DFT isolation walls 26, 26', 26", but do not extend across SP regions 36. In the prior art, the contribution of the lateral parasitic capacitance represented by capacitor symbols 37, has been neglected as being inconsequential compared to the inhered junction capacitance between, for example, NBL regions 27, 27', 27" and P-type substrate 22. However, it has been found that this simplifying assumption is incorrect and that such lateral parasitic capacitance does have in many cases a significant adverse effect on amplifier properties, and that it can be avoided, for example, by the improved designs presented in the various embodiments described herein.

Figure 4:
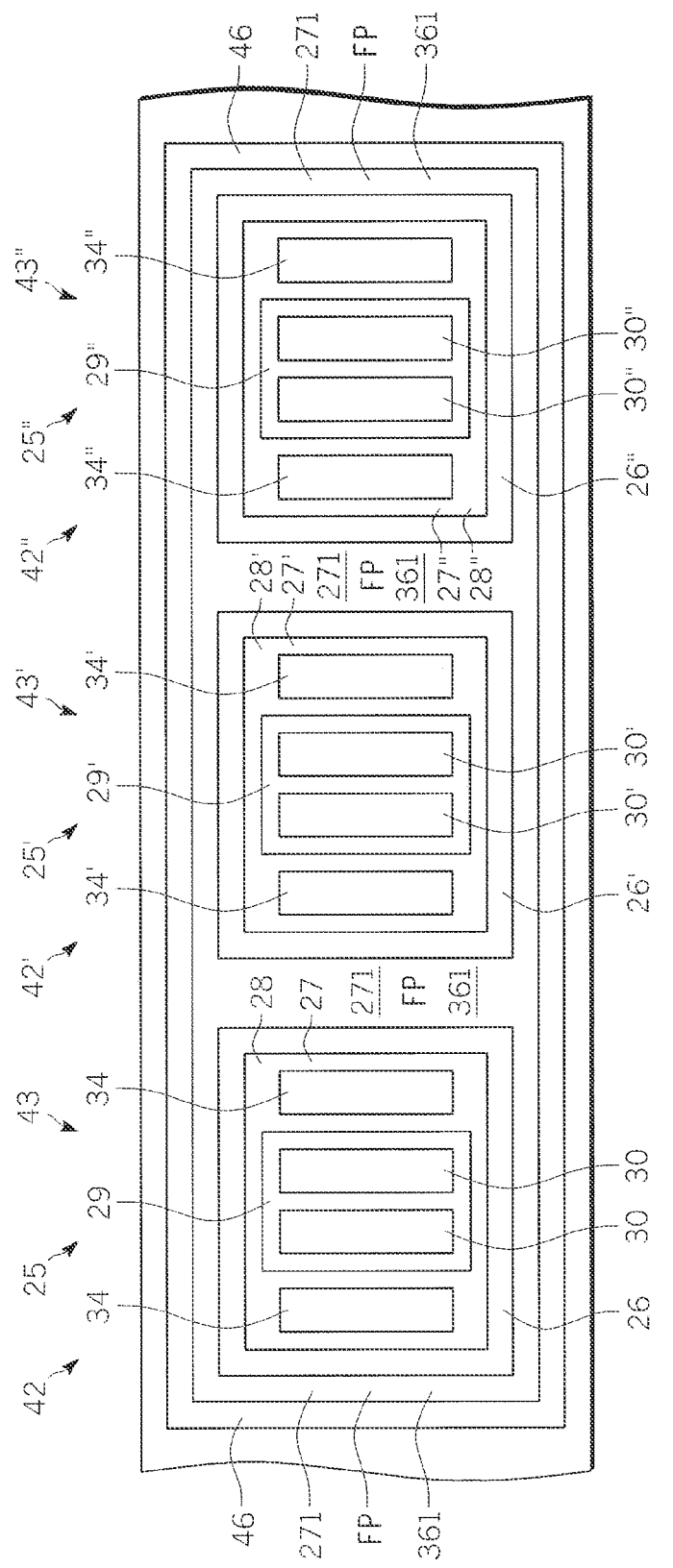
FIG. 4 is a simplified plan view of three unit cells of a bipolar amplifier analogous to that depicted in cross-section in FIG. 3.

FIG. 3 is a simplified schematic cross-sectional view of two unit cells 42, 42' of bipolar amplifier 40 formed in portions 43, 43' of device 40 and having reduced parasitic collector capacitance according to an embodiment of the present invention. FIG. 4 shows simplified plan view 48 of three unit cells 42, 42', 42" of bipolar amplifier 40' formed in portions 43, 43', 43" and analogous to that depicted in cross-section in FIG. 3. As noted earlier, any number of unit cells may be included depending upon the desired power output. In general, the doping densities and resistivities of the various regions of FIGS. 3-4 are substantially similar to those described for analogous regions of FIGS. 1-2. Considering FIGS. 3-4 together, amplifier 40, 40' differs from amplifier 20, 20' of FIGS. 1-2 by: (i) inclusion of additional peripheral DFT isolation wall 46 surrounding unit cells 42, 42', 42" and extending from surface 391 at least to substrate 22, and (ii) arranging for portions 361 formed in parts 431 of SP regions 36 lying laterally outside DFT isolation walls 26, 26', 26" and within further DFT isolation wall 46 to be electrically floating rather than ohmically coupled to substrate 22. Accordingly, such electrically floating portions or regions 361 are identified by the abbreviation "FP" indicating that they are electrically floating P-type regions. This is accomplished by providing buried layer regions 271 between DFT isolation walls 26, 26', 26" and between DFT isolation walls 26, 26', 26" and peripheral DFT isolation wall 46. Newly provided N-type NBL regions 271 between and around DFT isolation walls 26, 26', 26" are electrically floating since they are cut-off from buried layer regions 27, 27', 27" of transistors 25, 25', 25" by DFT isolation walls 26, 26', 26" and are isolated from substrate 22 by virtue of the PN junctions formed therebetween. Floating NBL regions 271 electrically isolate FP portions 361 from substrate 22, thereby also rendering FP portions 361 electrically floating. Since FP portions 361 are electrically floating they do not respond to changes in alternating current (AC) potential of N-type collector regions 28, 28', 28" or buried layer regions 27, 27', 27" across DFT isolation walls 26, 26', 26" and therefore the lateral parasitic capacitance represented by capacitor symbols 371 in FIG. 3 of amplifier structure 40, 40' of FIGS. 3-4 is significantly reduced compared to that exhibited by amplifier structure 20, 20' of FIGS. 1-2. This improvement is quantitatively illustrated in FIGS. 5-6.

It has been assumed in the foregoing description and in the description that follows, that isolation walls 26, 46 are comprised of dielectric filled trenches (DFTs). However, isolation walls 26, 46 may have non-dielectric cores, provided that such cores are left floating. For example, according to further embodiments, isolation walls having poly-semiconductor cores may be used. These poly-cores may be doped or undoped. As long as they are floating, they have no significant effect on the phenomena and solutions described herein. Accordingly, the words "dielectric filled trench isolation walls" and the abbreviation "DFT" and "DFT isolation walls" are intended to also include those isolation walls that may have floating conductive cores of poly or other conductive materials with a surrounding dielectric material located between the cores and the semiconductor regions on either side of the trench.

Figure 5:
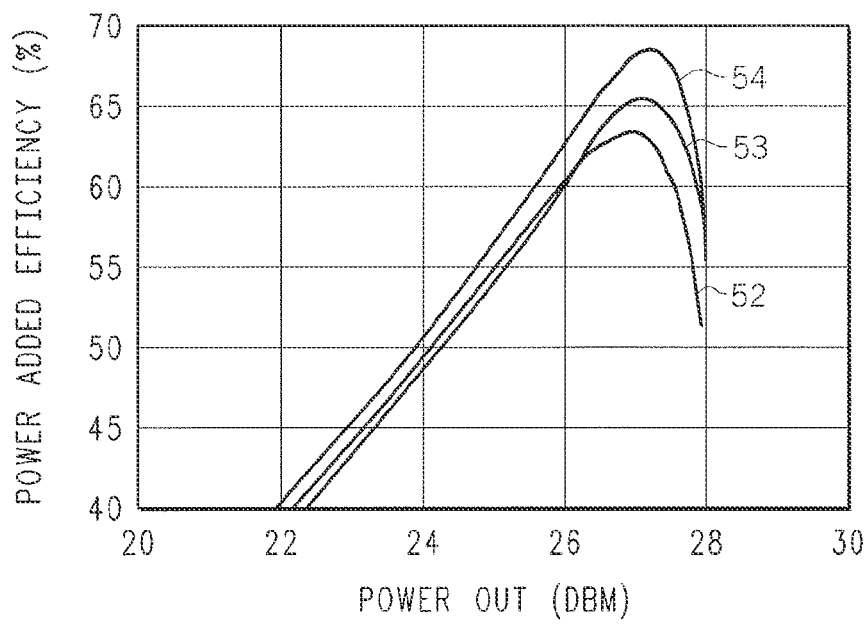
FIG. 5 is a plot of the power added efficiency in percent as a function of the output power in dBm, comparing the amplifiers of FIGS. 1-2 and FIGS. 3-4 and other variations.

FIG. 5 shows plot 50 of the power added efficiency in percent as a function of the output power in dBm, comparing the amplifiers of FIGS. 1-2 and FIGS. 3-4 operating at 1.9 GHz. Referring now to FIG. 5, power added efficiency (PAE) is a measure of how efficiently the amplifier converts direct current (DC) power to alternating current (AC) power and is defined as the ratio of the difference between the output AC power and the input AC power, divided by the input DC power, expressed as a percent. Assuming radio frequency (RF) operation, this is conveniently expressed by the formula:

$$PAE=100\times(RFPout-RFPin)/DCPin, \quad [\text{Eq. 1}]$$

where RFPout is the output RF power, RFPin is the input RF power and DCPin is the direct current (DC) power input to the amplifier. In FIG. 5, trace 52 shows PAE in percent versus RFPout for amplifier 20, 20' of FIGS. 1-2 and trace 53 shows PAE in percent versus RFPout for amplifier 40, 40' of FIG. 3-4. In these tests yielding traces, both amplifiers embodied 18 unit cells and, other than the modifications identified in (i) and (ii) above, were substantially similar and for traces 52, 53 had substrate resistivity of about 19 Ohm-cm. Further trace 54 shows PAE in percent versus RFPout for amplifier 40, 40' of FIG. 3-4 similar to that used in obtaining trace 53 but with a high resistivity substrate having a resistivity equal or greater than 500 Ohm-cm. It will be noted that a significant increase in PAE is obtained as a consequence of the invented embodiments. For future reference in connection with FIGS. 7-11, it is pointed out that trace 54 comprises two superimposed traces, a first trace showing the results for amplifier 40, 40' of FIGS. 3-4 with a high resistivity substrate as noted above, and a second co-incident trace showing the results for an amplifier of the same geometry as amplifier 40, 40' but with a further doped region underlying NBL 27 between NBL 27 and high resistivity substrate 22. This further doped layer had doping intermediate between NBL 27 and high resistivity substrate 22. The two traces 54 are substantially coincident. The reasons why such a further doped region is often desirable is explained in connection with FIGS. 7-11.

Figure 6:
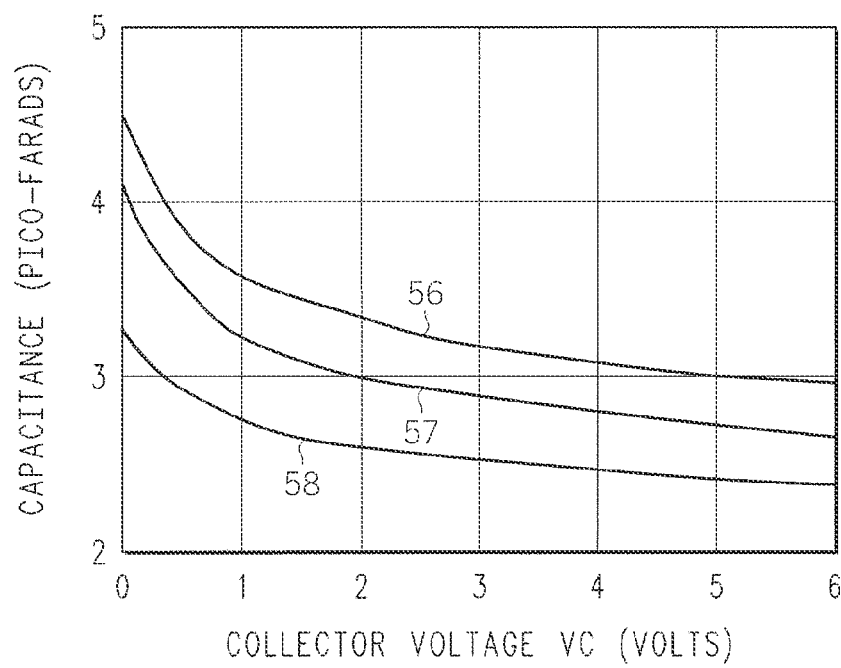
FIG. 6 is a plot of the collector capacitance in pico-farads as a function of collector voltage in volts, comparing the amplifiers of FIGS. 1-2 and FIGS. 3-4 and other variations.

FIG. 6 shows plot 55 of the collector capacitance in picofarads as a function of collector voltage in volts, comparing the amplifiers of FIGS. 1-2 and FIGS. 3-4, without and with the combined use of a high resistivity substrate, as discussed above. Trace 56 of FIG. 6 shows the collector capacitance versus collector-substrate voltage for device 20, 20' of FIGS. 1-2 with a standard substrate resistivity of about 19 Ohm-cm. Trace 57 of FIG. 6 shows the collector capacitance versus collector-substrate voltage for device 40, 40' of FIG. 3-4 with a standard substrate. Trace 58 of FIG. 6 shows the collector capacitance versus collector-substrate voltage for device 40, 40' of FIGS. 3-4 with a high resistivity substrate having a resistivity equal or greater than 500 Ohm-cm. It will be noted that a significant reduction in parasitic capacitance is obtained as a consequence of the invented embodiments.

Figure 7:
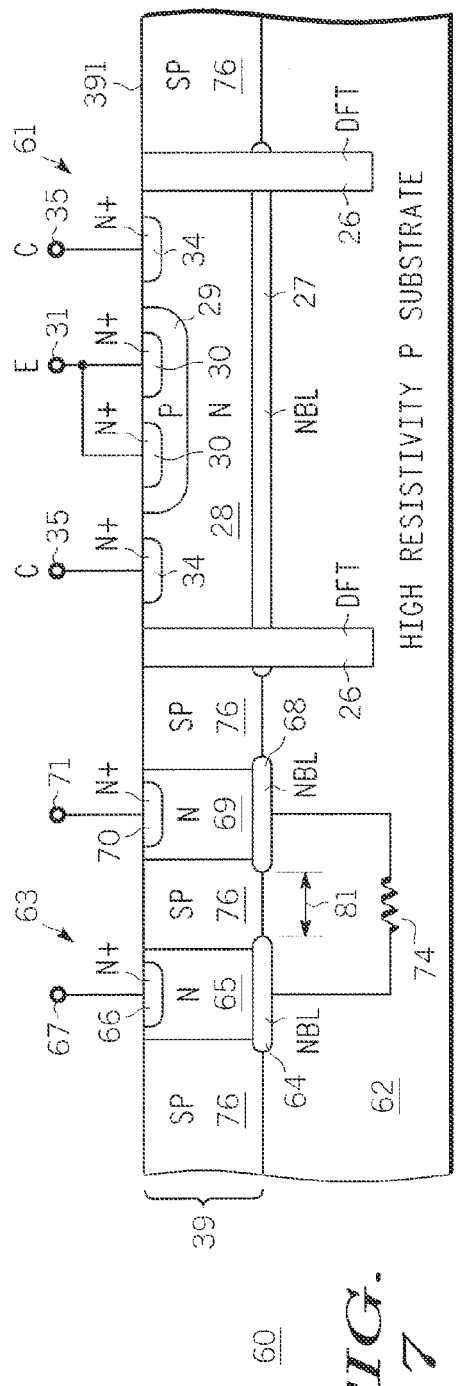
FIG. 7 is a simplified schematic cross-sectional view of one unit cell and buried layer (BL) contacts on the same die of a present day bipolar amplifier illustrating how undesirable parasitic buried layer (BL) leakage can arise.

While use of high resistivity substrates can reduce the parasitic capacitance of the amplifier and improve its power added efficiency, it can have deleterious effects in other parts of the same die. FIG. 7 shows a simplified schematic cross-sectional view of unit cell 61 of bipolar amplifier 60 analogous to amplifier 20, 20' of FIGS. 1-2, together with buried layer (BL) contact region 63 elsewhere on the same die, illustrating how undesirable parasitic buried layer (BL) leakage can arise. For convenience of illustration, BL contact region 63 and amplifying unit cell 61 are shown as being adjacent, but this is not essential and BL contact region 63 may be remote from amplifying unit cell 61. Amplifier unit cell 61 is substantially the same as unit cell 24 or 24' of FIGS. 1-2 and the description thereof is included herein by reference, with the proviso that substrate 62 of FIG. 7 is of high resistivity (e.g., resistivity of about 500 Ohm-cm or greater). Electrically and physically separated NBL regions 64 and 68 having separation 81 of, for example and not intended to be limiting, about 2.5 micrometers are illustrated in BL contact region 63. Larger or smaller separation may also be used. NBL region 64 having a doping density comparable to that of NBL 27 (e.g., sheet resistance of about 10 Ohms/sq.) is coupled to contact 67 by means of N sinker 65 and N+ contact region 66 having doping density similar to that of contact 34. NBL region 68 also having a doping density comparable to that of NBL 27 is coupled to contact 71 by means of N sinker 69 analogous to sinker 65 and N+ contact region 70 analogous to contact region 66. NBLs 64, 68, sinkers 65, 69, and N+ contact regions 66, 70 are electrically and physically separated by SP regions 76 analogous to SP regions 36 of FIGS. 1-2.

In multi-element devices, it is often the case that NBLs 64, 68 will be at different electrical potentials. It has been found that when substrate 62 is formed from high resistivity material, that significant electrical leakage can exist between NBLs 64, 68 via substrate 62, as represented by resistor 74. This parasitic leakage is undesirable since it wastes power, and adds to the joule heating of substrate 62 which is often a critical parameter in high power device structures and may cause other undesirable side-effects. Thus, if the use of a high resistivity substrate is attempted in order to lower the parasitic collector-substrate capacitance of the amplifier portions of the die or IC (e.g., in unit cell 61 or analogous unit cells 24, 24', 24''), this attempt may be rendered impractical by the increase in parasitic leakage described above between buried layer regions such as NBLs 64, 68 elsewhere on the die or IC.

Figure 8:
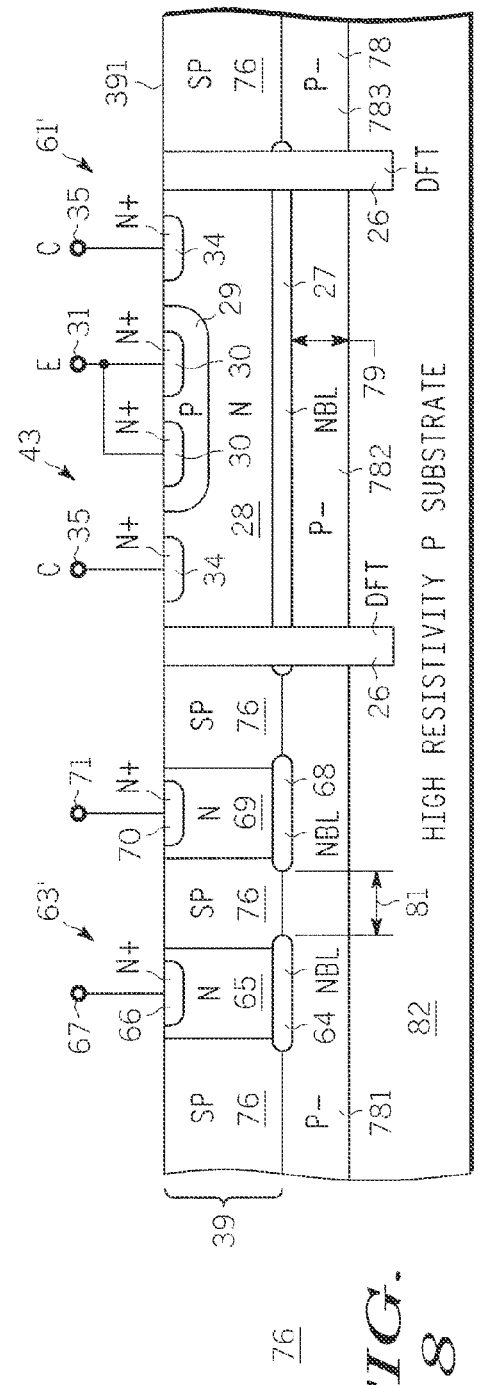
FIG. 8 is a simplified schematic cross-sectional view of a unit amplifier cell and buried layer (BL) contacts on the same die of a bipolar amplifier, according to a further embodiment of the present invention, illustrating how undesirable parasitic buried layer (BL) leakage can be reduced.

FIG. 8 shows a simplified schematic cross-sectional view of unit cell 61' of bipolar amplifier 76 analogous to amplifier 20, 20' of FIGS. 1-2, together with buried layer (BL) contact region 63' elsewhere on the same die, according to a further embodiment of the invention, showing how the undesirable parasitic buried layer (BL) leakage illustrated in connection with FIG. 7 can be avoided without adverse effect on the parasitic capacitance in amplifier unit cell 61'. As noted above, BL contact region 63' is shown as being adjacent to amplifying unit cell 61', but this is merely for economy of illustration and BL contact region 63' may be located anywhere in the same die as unit amplifying cell 61'. To facilitate comparison, spacing 81 between NBLs 64, 68 in FIG. 8 is substantially the same as in FIG. 7. Amplifier 76 of FIG. 8 differs from amplifier 60 of FIG. 7 by inclusion in amplifier 76 of additional P-type layer 78 having a maximum doping density of about 1E16 atoms/cm$^3$, intermediate between the doping density of NBLs 64, 68 (e.g., typically about 1E19 atoms/cm$^3$ or greater) and the doping density of high resistivity P-type substrate 62 (e.g., typically about 1E13 atoms/cm$^3$ or less). An implant dose of about 5E11 atoms/cm$^2$ with an energy of about 800 kilo-electron volts is suitable for layer 78, but lower or higher doses and energies may be used depending upon the depth of buried layer regions 64, 68, 27 and the doping thereof and of substrate 62. The effect of layer 78 is to reduce the leakage current (as shown in FIG. 9) that would otherwise occur between NBLs 64, 68 by reducing the width of depletion regions of the reverse biased p-n junctions associated with NBLs 64, 68, and thereby preventing punch through between such adjacent depletion regions.

Layer 78 is shown in FIG. 8 as having three portions; portion 781 beneath BL contact region 63', portion 782 beneath amplifier unit cell 61' and portion 783 beneath SP region 76 at the right side of FIG. 8. Only portion 781 is needed to reduce the leakage between NBLs 64, 68. By performing a masked implant with unit cell 61' (and SP region 76 at the right side of FIG. 8) covered, portion 782 (and 783) may be omitted so that only portion 781 is provided. Portion 781 is sufficient to reduce the parasitic leakage illustrated in FIG. 7 as shown in FIG. 9. However, for convenience of manufacturing, it is sometimes desirable to provide layer 78 by means of an unmasked blanket implant, which provides layer 78 in contact with and extending below NBLs 64, 68, 27. Having portion 782 between NBL 27 and substrate 62 does not adversely affect the performance of amplifier unit cell 61' if the doping in portion 782 is chosen so that portion 782 is completely depleted under operating conditions. This is illustrated by trace 54 of FIG. 5, wherein the PAE behavior of an amplifier of the type illustrated in FIGS. 3-4 with and without layer 78 were found to be substantially the same, so that their PAE versus Pout traces are substantially coincident traces 54.

Figure 9:
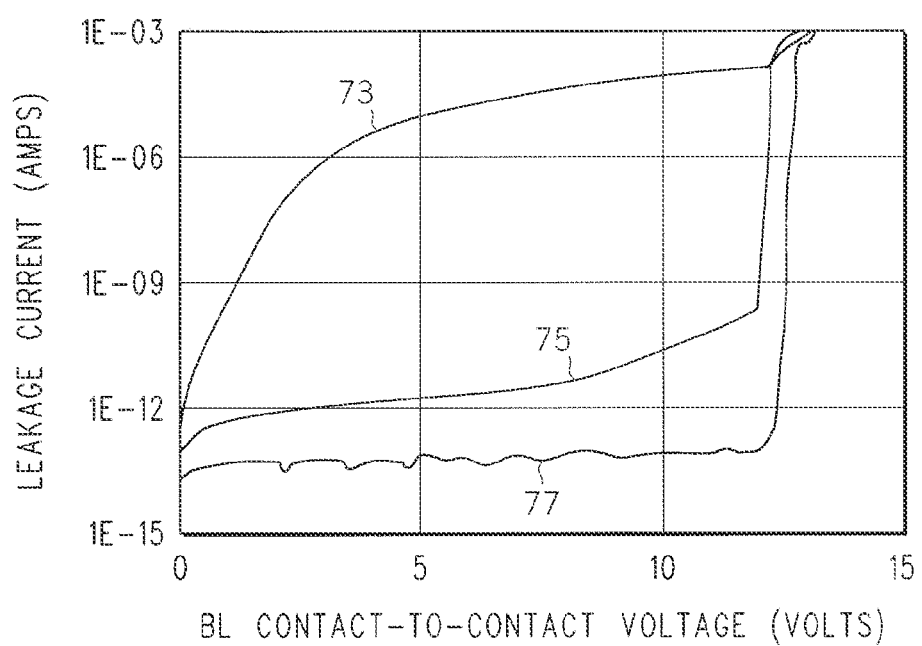
FIG. 9 is a plot of buried layer leakage current in Amperes as a function of bias voltage in volts for the arrangement of FIGS. 7 and 8 under various conditions.

FIG. 9 shows plot 72 of buried layer leakage current in Amperes as a function of NBL 64 to NBL 68 contact-to-contact bias voltage in volts for the arrangement of FIGS. 7 and 8 under various conditions. Trace 73 shows the leakage current between NBLs 64, 68 of BL contact region 63 of FIG. 7 wherein substrate 62 is of high resistivity material with a resistivity of about 500 Ohm-cm or greater and no implant layer equivalent to layer 78 of FIG. 8. Trace 77 shows the leakage current between NBLs 64, 68 of BL contact region 63 of FIG. 7 wherein substrate 62 has the standard resistivity of about 19 Ohm-cm and NBLs 64, 68 are laterally spaced about 2.5 micrometers apart. A comparison of traces 73 and 77 illustrates the very large adverse leakage effect than can arise merely from using a high resistivity substrate in an attempt to reduce the parasitic capacitance of an amplifier elsewhere on the same die. Trace 75 shows the leakage current between NBLs 64, 68 of BL contact region 63' of FIG. 8 wherein substrate 62 is of high resistivity material with a resistivity of about 500 Ohm-cm or greater and with layer 78 provided by an implant of about 5E11 ions/cm$^2$ at 800 keV, as has been previously described in connection with FIG. 8. It will be noted that providing region 781 of layer 78 underneath NBLs 64, 68 of BL contact region 63' as described in connection with FIG. 8, reduces the leakage that would otherwise accompany use of a high resistivity substrate by about six to seven orders of magnitude, and as shown by co-incident trace 54 of FIG. 5 (as noted above), without any adverse effect on the PAE of amplifier unit cell 61' on the same die. The arrangement of FIG. 8 makes it possible to avoid the excess BL contact leakage when using a high resistivity substrate, which might otherwise preclude its use to help in lowering the parasitic capacitance of an associated amplifier on the same die.

Figure 10:
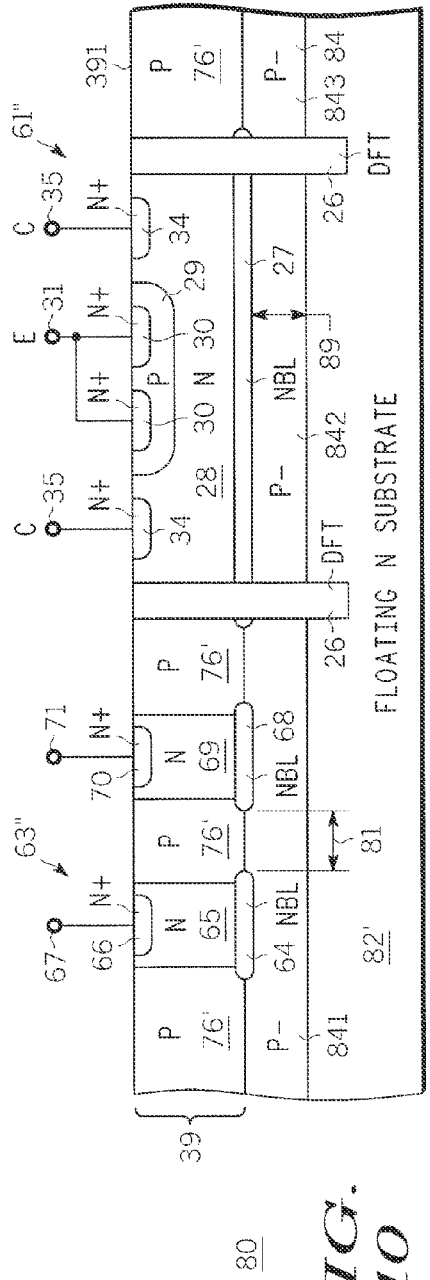
FIG. 10 is a simplified schematic cross-sectional view of a unit amplifier cell and buried layer (BL) contacts on the same die of a bipolar amplifier, according to a still further embodiment of the present invention, illustrating how undesirable parasitic buried layer (BL) leakage can be reduced without adverse impact on parasitic collector capacitance of the amplifier.

FIG. 10 shows a simplified schematic cross-sectional view of unit amplifier cell 61" and associated buried layer (BL) contact region 63" of bipolar amplifier 80, according to a still further embodiment of the present invention. Amplifier 80 of FIG. 10 has N-type substrate 82' having a resistivity of about 500 Ohm-cm or greater. Substrate 82' is desirably floating, that is, not coupled to the reference potential of amplifier 80. Amplifier 80 has P-type layer 84 of thickness 89 similar to P-type layer 78 of FIG. 8, but it may have a higher doping density than P-type layer 78 of FIG. 8. Like layer 78, layer 84 has portion 841 beneath BL contact region 63", portion 842 beneath unit amplifying cell 61" and portion 843 beneath P region 76' at the right side of FIG. 10. Since substrate 82' is N-type, it forms a PN junction with layer 84, and P regions 76' are no longer ohmically coupled to substrate 82. By replacing P-type substrate 62 with N-type substrate 82', the parasitic capacitance associated with amplifying unit cell 61" is reduced. Because layer 84 is not a high resistivity layer but of intermediate resistivity or dopant concentration analogous to layer 78 of FIG. 8 (or higher), the leakage between NBLs 64, 68 is reduced compared to that of FIG. 7.

Figure 11:
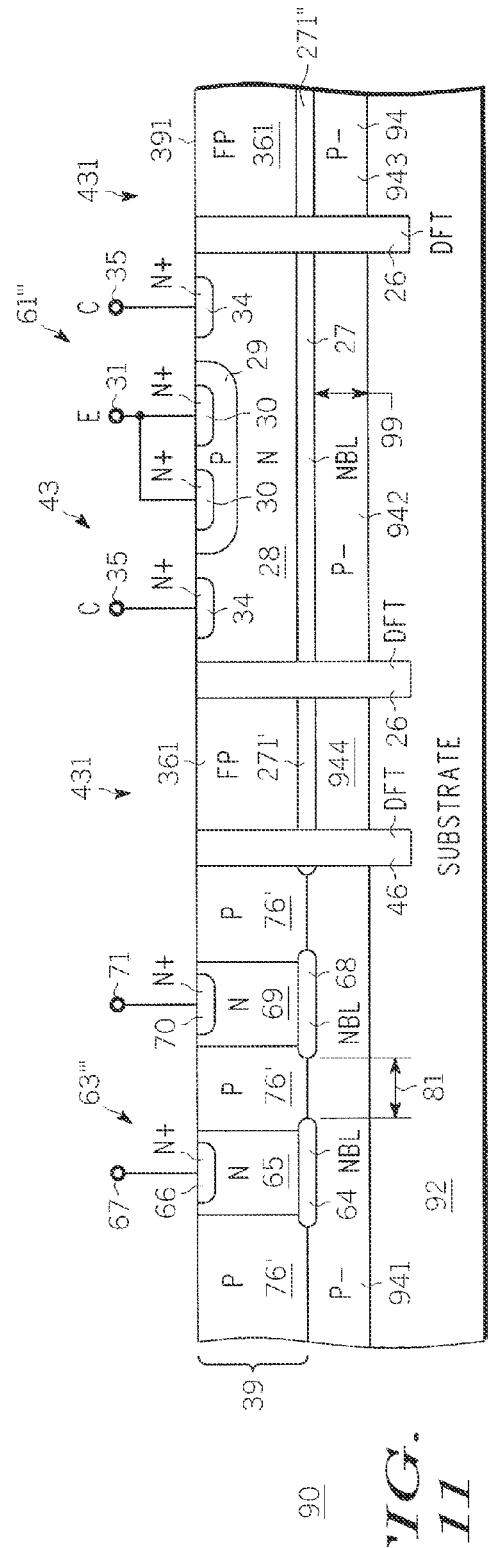
FIG. 11 is a simplified schematic cross-sectional view of a unit amplifier cell and buried layer (BL) contacts on the same die of a bipolar amplifier, according to a yet still further embodiment of the present invention, illustrating how undesirable parasitic buried layer (BL) leakage can be reduced in combination with the arrangement of FIGS. 3-4 for reducing collector capacitance.

FIG. 11 shows a simplified schematic cross-sectional view of unit amplifier cell 61''' and buried layer (BL) contact region 63''' of a bipolar amplifier 90, according to a yet still further embodiment of the present invention. FIG. 11 differs from FIGS. 7-8 and 10 in that unit amplifying cell 61' incorporates the structure illustrated in unit amplifying cells 42, 42', 42" of FIG. 3-4, which substantially reduces the lateral parasitic capacitance and further improves the PAE. Layer 94 has at least portion 941 and in other embodiments also one or more of portions 942-944. Layer 94 is P-type. Substrate 92 may be P-type, as described in connection with FIG. 8 or N-type as described in connection with FIG. 10, depending upon the desires of the designer and capability of the manufacturing process. As a consequence of incorporating the structure of unit amplifying cells 42, 42', 42", etc., P-regions 361 located in parts 431 between DFT isolation walls 26, 26', 26" and between DFT isolation walls 26, 26', 26" and DFT isolation wall 46 are no longer ohmically coupled to substrate 92 and are identified as floating P-regions, abbreviated as "FP", as a consequence of additional buried layer regions 271', 271". When substrate 92 is high resistivity P-type, the maximum reduction in collector-substrate capacitance is obtained in unit amplifying cells 61''' and where region 941 is P-type and of intermediate doping density as described in connection with FIG. 8, the problem of significant leakage between NBL contacts 64, 68 of spacing 81 is avoided without adverse affect on the PAE behavior of unit amplifying cell 61'''. The configuration of FIG. 11 is preferred since both low capacitance, high PAE and low BL contact leakage can be obtained. This is highly desirable.

According to a first embodiment, there is provided a semiconductor amplifier comprising, a semiconductor substrate, a semiconductor (SC) layer overlying the substrate and having an outer surface, one or more semiconductor unit amplifying cells formed in a first part of the SC layer; one or more first dielectric filled trenches (DFTs), wherein each of the one or more semiconductor unit amplifying cells is laterally surrounded by one of the one or more first DFTs, which first DTFs extend through the SC layer from the outer surface to at least the substrate, a second DFT laterally surrounding the one or more first DTFs and extending through the SC layer from the outer surface at least to the substrate, and further semiconductor regions located in a second part of the SC layer between the first and second DFTs, and wherein the further semiconductor regions are electrically floating with respect to the substrate. According to a further embodiment, the semiconductor substrate is of a first conductivity type and the one or more unit amplifying cells comprise, a collector region of a second, opposite conductivity type, a base region of the first conductivity type located in the collector region, an emitter region of the second opposite conductivity type located within the base region, and a first buried layer (BL) region of the second, opposite conductivity type separating the collector region from the substrate and extending laterally across the first DFT surrounding each unit amplifying cell, and wherein the further semiconductor regions are separated from the substrate by a second BL region of the second, opposite conductivity type. According to a still further embodiment, the amplifier further comprises two or more third BL regions of the second, opposite, conductivity type located in one or more further parts of the SC layer laterally outside the second DFT, wherein the third BL regions are coupled to the outer surface of the SC layer by additional regions of the second opposite conductivity type and the third BL regions and additional regions are separated by still further semiconductor regions of the first conductivity type. According to a yet further embodiment, a portion of the substrate underlying the third BL regions has two or more parts of different doping density, a first part of a first doping density underlying and separated from the third BL regions and a second part lying between the third BL regions and the first part of the substrate, wherein the second part of the substrate has a second doping density intermediate between a doping density of the third BL regions and the doping density of the first part of the substrate. According to a still yet further embodiment, the first part of the substrate is of high resistivity. According to a yet still further embodiment, the amplifier further comprises a first buried layer (BL) extending laterally across and underlying at least one of the one or more unit amplifying cells, wherein the first BL is laterally bounded by the first DFT surrounding the at least one unit amplifying cell, and wherein the first BL is of a first doping type and first doping level, and the substrate is of a second, opposite conductivity type and has a first part separated from and lying beneath the first BL and of a second doping level less than the first doping level and a second part lying between the first part and the BL and of a third doping level intermediate between the first and second doping levels. According to an additional embodiment, the first part of the substrate has a resistivity equal or greater than about 500 Ohm-cm. According to a still additional embodiment, the BL has a sheet resistance of about 10 Ohms/sq. According to a yet additional embodiment, at least the first DFT has a polycrystalline semiconductor core.

According to a second embodiment, there is provided a semiconductor device, comprising, a substrate of a first conductivity type and having a first portion in which are located one or more amplifier unit cells, two or more dielectric filled trench (DFT) isolation walls, comprising, first isolation walls laterally surrounding each of the one or more unit amplifying cells, and a second isolation wall separated from the one or more first isolation walls and collectively laterally surrounding the first isolation walls, and semiconductor regions overlying the substrate and of the first conductivity type lying between the first and second isolation walls, and wherein the semiconductor regions are electrically floating with respect to the substrate. According to a further embodiment, the semiconductor device further comprises buried layer (BL) regions of a second, opposite conductivity type having first portions underlying the one or more amplifying unit cells and second portions electrically separated from the first portions and underlying further semiconductor regions located outside the first DFT isolation walls. According to a still further embodiment, the first portion of the substrate in which are located the one or more amplifier unit cells further comprises buried layer (BL) regions of a second, opposite conductivity type and BL doping concentration underlying the one or more amplifying unit cells and extending laterally within the first isolation walls laterally surrounding each of the one or more unit amplifying cells, wherein the first portion of the substrate has parts of different doping concentrations beneath the BL regions, a first part in contact with the BL region of a first doping concentration less than the BL doping concentration and a second part underlying the first part and of a second doping concentration less than the first doping concentration. According to a yet further embodiment, the second doping concentration corresponds to a resistivity greater than or equal to about 500 Ohm-cm. According to a still yet further embodiment, the substrate further comprises, a second portion separated from the first portion, the second portion comprising spaced-apart buried layer (BL) regions of a second, opposite conductivity type and BL doping concentration, having contact sinkers extending from these spaced-apart BL regions to an external surface adapted to receive electrical connections thereto; and wherein a part of the second portion underlying the spaced-apart BL regions comprises a first region of the first conductivity type and a first doping concentration less than the BL doping concentration and a second region of the first conductivity type and a second doping concentration less than the first doping concentration. According to a yet still further embodiment, the second doping concentration corresponds to a resistivity of about 500 Ohm-cm or more.

According to a third embodiment, there is provided an electronic device, comprising, a semiconductor substrate of a first conductivity type and having a first surface, spaced-apart first buried layer (BL) regions of a second, opposite, conductivity type and BL doping concentration, located within the substrate and spaced apart from the first surface, contact sinker regions of the second, opposite, conductivity type, extending substantially from the first surface to the spaced-apart first BL regions and adapted to facilitate individual electrical contact to the spaced-apart first BL regions, wherein a first portion of the semiconductor substrate underlying the spaced-apart first BL regions has a first doping concentration less than the BL doping concentration, and a second portion of the semiconductor substrate underlying the first portion has a second doping concentration less than the first doping concentration. According to a further embodiment, the second doping concentration corresponds to a resistivity equal or greater than about 500 Ohm-cm.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:
1. An electronic device, comprising:
   a semiconductor substrate of a first conductivity type and having a first surface;
   spaced-apart first buried layer (BL) regions of a second, opposite, conductivity type and BL doping concentration, located within the substrate and spaced apart from the first surface;
   contact sinker regions of the second, opposite, conductivity type, extending substantially from the first surface to the spaced-apart first BL regions and adapted to facilitate individual electrical contact to the spaced-apart first BL regions; wherein
     a first portion of the semiconductor substrate underlying the spaced-apart first BL regions has a first doping concentration less than the BL doping concentration; and
     a second portion of the semiconductor substrate underlying the first portion has a second doping concentration less than the first doping concentration.
2. The electronic device of claim 1, wherein the second doping concentration corresponds to a resistivity equal or greater than about 500 Ohm-cm.

3. The electronic device of claim 1, further comprising:
one or more unit amplifiers located in the substrate separated from the spaced-apart first BL regions;
one or more first lateral dielectric filled trench (DFT) isolation walls, each first lateral DFT isolation wall laterally surrounding one of the one or more unit amplifiers;
at least one second lateral DFT isolation wall, surrounding collectively the one or more first lateral DFT isolation walls;
a further semiconductor region of the same conductivity type as the substrate and lying between the first and second lateral DFT isolation walls proximate the first surface; and wherein
the further semiconductor region is electrically isolated from the substrate.

4. The electronic device of claim 3, wherein the further semiconductor region is electrically isolated from the substrate by further buried layer (BL) regions of the second, opposite, conductivity type, electrically isolated from the first BL regions and the one or more unit amplifiers.

5. The electronic device of claim 4, wherein the first portion of the semiconductor substrate extends beneath the further BL regions.

6. The electronic device of claim 1, further comprising:
one or more unit amplifiers located in the substrate separated from the spaced-apart first BL regions; and
one or more first lateral dielectric filled trench (DFT) isolation walls, each first lateral DFT isolation wall laterally surrounding one of the one or more unit amplifiers.

7. The electronic device of claim 6, wherein the first lateral DTF isolation walls extend from the first surface to at least the semiconductor substrate.

8. The electronic device of claim 6, wherein the one or more unit amplifiers each comprise:
a collector region of the second, opposite conductivity type;
a base region of the first conductivity type located in the collector region;
an emitter region of the second, opposite conductivity type located within the base region; and
a first buried layer (BL) region of the second, opposite conductivity type separating the collector region from the first semiconductor layer and extending laterally between the first lateral DFT isolation walls surrounding each unit amplifying cell.

9. The electronic device of claim 6, further comprising:
at least one second lateral DFT isolation wall, surrounding collectively the one or more first lateral DFT isolation walls.

10. An electronic device, comprising:
a semiconductor substrate having a first doping concentration;
a first semiconductor layer overlying the semiconductor substrate and having a first conductivity type and a second doping concentration that is greater than the first doping concentration;
a second semiconductor layer overlying the first semiconductor layer and having the first conductivity type and a first surface;
spaced-apart first buried layer (BL) regions of a second, opposite conductivity type and BL doping concentration, located between the first and second semiconductor layers and spaced apart from the first surface; and
contact sinker regions of the second, opposite conductivity type, extending substantially from the first surface to the spaced-apart first BL regions and adapted to facilitate individual electrical contact to the spaced-apart first BL regions.

11. The electronic device of claim 10, wherein the second doping concentration is less than the BL doping concentration.

12. The electronic device of claim 10, wherein the semiconductor substrate has the first conductivity type.

13. The electronic device of claim 10, wherein the semiconductor substrate has the second, opposite conductivity type.

14. The electronic device of claim 10, further comprising:
one or more unit amplifiers located in the substrate separated from the spaced-apart first BL regions; and
one or more first lateral dielectric filled trench (DFT) isolation walls, each first lateral DFT isolation wall laterally surrounding one of the one or more unit amplifiers.

15. The electronic device of claim 14, wherein the first lateral DTF isolation walls extend from the first surface to at least the semiconductor substrate.

16. The electronic device of claim 14, wherein the one or more unit amplifying cells each comprise:
a collector region of the second, opposite conductivity type;
a base region of the first conductivity type located in the collector region;
an emitter region of the second, opposite conductivity type located within the base region; and
a first buried layer (BL) region of the second, opposite conductivity type separating the collector region from the first semiconductor layer and extending laterally between the first lateral DFT isolation walls surrounding each unit amplifying cell.

17. The electronic device of claim 14, wherein the first lateral DFT isolation walls have a polycrystalline semiconductor core.

18. The electronic device of claim 14, further comprising:
at least one second lateral DFT isolation wall, surrounding collectively the one or more first lateral DFT isolation walls; and
a further semiconductor region of the first conductivity type and lying between the first and second lateral DFT isolation walls, wherein the further semiconductor region is electrically isolated from the substrate by a portion of the first semiconductor layer.

19. The electronic device of claim 18, wherein the second lateral DTF isolation wall extends from the first surface to at least the semiconductor substrate.

20. The electronic device of claim 10, wherein the semiconductor substrate is of high resistivity.

* * * * *